(12) United States Patent
Hashimoto

(10) Patent No.: US 6,255,842 B1
(45) Date of Patent: Jul. 3, 2001

(54) APPLIED-VOLTAGE-BASED CURRENT MEASURING METHOD AND DEVICE

(75) Inventor: Yoshihiro Hashimoto, Urawa (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/341,893

(22) PCT Filed: Dec. 2, 1997

(86) PCT No.: PCT/JP97/04398

§ 371 Date: Jul. 20, 1999

§ 102(e) Date: Jul. 20, 1999

(87) PCT Pub. No.: WO99/28756

PCT Pub. Date: Jun. 10, 1999

(51) Int. Cl.[7] ............................ G01R 31/26; G01R 31/02
(52) U.S. Cl. .......................... 324/765; 324/763; 323/316
(58) Field of Search ..................... 324/765, 763, 324/769, 761, 767; 323/316

(56) References Cited

U.S. PATENT DOCUMENTS 5,874,827 * 2/1999 Hashimoto ........................ 323/234

FOREIGN PATENT DOCUMENTS 63-19280   2/1988 (JP) .
63-190975 12/1988 (JP) .
1129667   9/1989 (JP) .

* cited by examiner

Primary Examiner—Safet Metjahic
Assistant Examiner—J. Kerveros
(74) Attorney, Agent, or Firm—Gallagher & Lathrop; David N. Lathrop

(57) ABSTRACT

An applied-voltage-based current measuring apparatus in which an operational amplifier is supplied at its non-inverting input terminal with a predetermined voltage and at its inverting input terminal with a voltage to be applied to a load. A current measuring resistor is connected between the output terminal of the operational amplifier and the load and a voltage which is created across the current measuring resistor is measured to thereby measure a current flow to the load in the state of being supplied with a predetermined voltage and in which a plurality of current measuring resistors are connected in series in correspondence to current measuring ranges. Switching elements for current bypass use, each of which turns ON when the voltage created across the corresponding current measuring resistor reaches a predetermined value, are connected in parallel to the current measuring resistors. Automatically carrying out sequential measurements of voltages created at respective ends of the current measuring resistors. The measured results are subjected to subtraction processing to compute voltages which are developed across the current measuring resistors. The apparatus selects from the computed results an optimum value contained in any one of the measuring ranges, thereby specifying the current flowing to the load.

9 Claims, 5 Drawing Sheets

US 6,255,842 B1

APPLIED-VOLTAGE-BASED CURRENT MEASURING METHOD AND DEVICE

FIELD OF THE INVENTION

The present invention relates to an applied-voltage-based current measuring device that can be used, for example, to make a check to determine whether the DC characteristic of each terminal of a semiconductor integrated circuit element (hereinafter referred to as an IC) falls within a predetermined range.

BACKGROUND ART

IC tests fall into a function test and a DC test. The function test is a test to see if the IC under test performs predetermined functions. The DC test is a test to see if a leakage current at an input terminal of the IC under test, for instance, is smaller than a predetermined value, or if the output current at an output terminal is larger than a predetermined value.

The present invention is directed to improvements in an applied-voltage-based current measuring device for use in the DC test; in particular, the invention is to adapt the current measuring device to be capable of measuring current values accurately without using any highly precision resistors and at high speed without switching between current measuring ranges.

In FIG. 4 there is depicted an example of a conventional applied-voltage-based current measuring device. In FIG. 4, reference numeral 11 denotes an IC under test, 12 a voltage source from which a predetermined voltage is applied to a terminal of the IC under test, and 13 current measuring means for measuring current that flows to the terminal of the IC under test 11 during periods of voltage application. The applied-voltage-based current measuring device is composed of the voltage source 12 and the current measuring means 13.

The voltage source 12 is made up of an operational amplifier 12A and a D/A converter 12B which supplies a voltage equal to a voltage to be applied to a terminal of the IC under test 11. To an inverting input terminal of the operational amplifier 12A is fed back from a sensing point (a voltage sensing point) SEN a voltage $V_1$ applied to the terminal of the IC under test 11; by this feedback operation, the voltage V1 is made to match a voltage $V_{DA}$ from the D/A converter 12B, thus applying an intended voltage (for example, a voltage that defines H logic and L logic) to the terminal of the IC under test 11.

The current measuring means 13 is made up of a current measuring resistor R1 connected between an output terminal of the operational amplifier 12A and the sensing point SEN, a subtractor circuit 13A for extracting a voltage that develops across the current measuring resistor R1, and an A/D converter 13B for A/D conversion of the voltage extracted by the subtractor circuit 13A.

Incidentally, reference characters R2 and R3 denote resistors for range changeover use. These range change-over resistors R2 and R3 are adapted to be connected in parallel to the current measuring resistor R1 through selective turning-ON of range change-over switches S2 and S3, thereby switching the current measuring means 13 between its current measuring ranges.

That is, when the range change-over switches S2 and S3 are both in the OFF state and when the range change-over switch S2 is in the ON state, the current measuring means is put in the state of measuring a leakage current at one of terminals of the IC under test which is held in the input mode, and it measures minute currents approximately in the range of several to tens of microamperes. To perform this, the resistance values of the current measuring resistors R1 and R2 are chosen relatively large on the order of tens of kiloohms.

On the other hand, the resistance value of the range switch-over resistor R3 is chosen relatively small, for example, 10 ohms or so. Accordingly, when the switch S3 is put in the ON state, the current measuring means is switched to a measuring range of a relatively large current value, and measures current is provided from that one of terminals of the IC under test 11 which is held in the output mode.

The circuit configuration of FIG. 4 has the defect of requiring the range change-over switches S2 and S3. In other words, since the range change-over switches S2 and S3 are connected in series to the circuit through which the current to be measured flows, it is necessary, in particular, to minimize the ON-state resistance of the range change-over switch S3 through which a large current flows. On this account, a CMOS-structured semiconductor switching element cannot be used as the range change-over switch S3, but instead a relay is used commonly. Because of the relay's slow response, much time is needed for switching the measuring range. Furthermore, the current measurement starts at a high-sensitivity measuring range, and when the measured value falls outside it, the measuring range is switched to the next one and the current measurement is carried out again. This inevitably provides disadvantages that the switching of the measuring range is time-consuming and that when the measuring range is switched from a minute to a large current one (by turning ON the switch S3), much time is also taken for the circuit to settle back after the switching of the measuring range. The prior art example has another disadvantage of requiring much time for test because of repeating for each terminal the measurements of a leakage current and the output current of the IC under test 11 through the use of a single applied-voltage-based current measuring device.

Besides, the subtractor circuit 13A comprises, as depicted in FIG. 4, an operational amplifier A1, a buffer amplifier A2 and resistors R11, R12, R13 and R14. In this arrangement the resistance values of the resistors R11, R12, R13 and R14 need to be set, for example, such that R12/R11=R14/R13=1. This relationship of the resistors R11 to R14 has a significant effect on the determination of the gain of the operational amplifier A1 and the determination of its common-mode rejection ratio. Since the resistance values of the resistors R11 and R12 to R14 must therefore be set with high accuracy, the manufacturing cost of the subtractor circuit 13A is high, in particular, when implemented in an IC, because of difficulty in setting the resistance values of the resistors R11 to R14 with high accuracy.

As a solution to the above problems, there has been proposed such a circuit as shown in FIG. 5. In this circuit a series circuit of the range change-over resistor R2 and the range change-over switch S2 and diodes D1 and D2 are connected in parallel to the current measuring resistor R1, and the resistor R3 for large current measuring use is independently connected in series to the current measuring resistor R1; voltages that develop across the resistors R1 and R3 are extracted by subtractor circuits 13A and 13A', and the voltages thus extracted by the subtractor circuits 13A and 13A' are selectively provided via switches S22 and S33 into the A/D converter 13B.

With this circuit configuration, in a minute current region (a current region in which the diodes D1 and D2 remain OFF) the switch S22 is held in the ON state, through which a voltage developed by a current flow through the current measuring resistor R1 or a parallel circuit of the resistors R1 and R2 is applied to the A/D converter 13B to measure a minute current (a leakage current at each terminal of the IC under test 11).

In a large current region, since the voltage across the current measuring resistor R1 exceeds a value at which the diode D1 or D2 turns ON, a large current bypasses R1 through the diode D1 or D2 and the voltage across the current measuring resistor R1 is clamped at a conduction voltage (for example, 0.6 V or so) of the diode D1 or D2; in this state, a voltage across the current measuring resistor R3 is extracted by the subtractor circuit 13A' and provided via the switch S23 to the A/D converter 13B for measuring the large current.

With the circuit configuration depicted in FIG. 5, it is only the switch S2 that is used as the range change-over switch. Since the current measuring range is not greatly changed by the operation of the range change-over switch S2, the settling time of the circuit is short. In addition, since the circuit is a minute current circuit, it is possible to use a DMOS type semiconductor switch as the range change-over switch S2 and hence permit reduction of the change-over time as well. This provides an advantage that the time for switching the measuring range can be reduced.

However, this prior art example requires two subtractor circuits as identified by 13A and 13A', which makes its manufacturing costs higher than in the case of FIG. 4. Moreover, the use of the DMOS-structured switching element as the range change-over switch S2 would provide the disadvantage of further raising the overall manufacturing costs since the DMOS-structured switching element is expensive.

An object of the present invention is to provide an applied-voltage-based current measuring method which permits high-speed measurements of minute to large currents and an applied-voltage-based current measuring apparatus for implementing the method at low cost.

SUMMARY OF THE INVENTION

The present invention proposes an applied-voltage-based current measuring method which: applies the output voltage of an operational amplifier to a voltage sensing point via a current detecting resistor; supplies a load with the voltage applied to the voltage sensing point; feeds back the voltage at the voltage sensing point to an inverting input terminal of the operational amplifier; supplies the load with a voltage identical with that fed to an non-inverting input terminal of the operational amplifier; and measures current flowing to the load by a voltage which is developed across the current measuring resistor;

wherein: a plurality of current detecting resistors are prepared in correspondence to current measuring ranges; the plurality of current measuring resistors are connected in series between an output terminal of the operational amplifier and the voltage sensing point; voltages which are developed at respective ends of the plurality of current detecting resistors are measured; the measured voltages are subjected to arithmetic processing to compute voltages which are created across the respective current detecting resistors; and the thus computed voltages are used to calculate the value of current flowing to the load.

This applied-voltage-based current measuring method measures the voltages which are created at respective ends of the current detecting resistors, and subjects the measured voltages to arithmetic processing to calculate voltages which are developed across the current detecting resistors; therefore, no analog subtractor circuits are required. Accordingly, there is no need of setting the resistance values of resistors with high accuracy in the fabrication of an IC forming the current measuring circuit; hence, it is possible to form the current measuring circuit by low-cost elements.

Furthermore, the present invention proposes an applied-voltage-based current measuring apparatus in which: an operational amplifier is supplied at its non-inverting input terminal with a predetermined voltage and at its inverting input terminal with a voltage to be applied to a load; a current measuring resistor is connected between the output terminal of the operational amplifier and the load; and a voltage which is created across the current measuring resistor is measured to thereby measure a current flow to the load in the state of being supplied with a predetermined voltage; comprising:

a plurality of current measuring resistors which are connected in series between the output terminal of the operational amplifier and the load, and have their resistance values chosen corresponding to current measuring ranges, respectively;

switching elements for current bypass use which are connected in parallel to the plurality of current measuring resistors and turn ON when voltages created across the current measuring resistors reach predetermined values; and arithmetic processing control unit which effects control for automatically carrying out sequential measurements of voltages created at respective ends of the current measuring resistors, subjects the measured results to subtraction processing to compute voltages which are developed across the current measuring resistors, selects from the computed results an optimum value contained in any one of the measuring ranges, and calculates the value of current flowing to the load.

With the arrangement of the applied-voltage-based current measuring apparatus according to the present invention, all the current measuring resistors are connected in series and the switching elements for current bypass use are connected in parallel to each current measuring resistors; therefore, by specifying that one of the current measuring resistors across which is developed a voltage that does not turn ON the corresponding switching element for current bypass use, a correct current value can be derived from the voltage created across that resistor.

As described above, the present invention does not embrace the concept of switching the measuring range but carries out the current measurement with all the current measuring resistors connected in series, and consequently, no time is wasted on switching of the measuring range. Accordingly, the time for measurement can be reduced since no time is needed for changing over the measuring range as mentioned above.

Besides, the change-over of the measuring range does not involve the connection and disconnection of the current measuring resistors, and hence it may be done without waiting until the circuit become stabilized. This also provides the advantage of reducing the measuring time.

DETAILED DESCRIPTION OF THE INVENTION

A description will be given, with reference to FIG. 1, of an applied-voltage-based current measuring method and an applied-voltage-based current measuring apparatus using the measuring method in accordance with an embodiment of the present invention.

Figure 1:
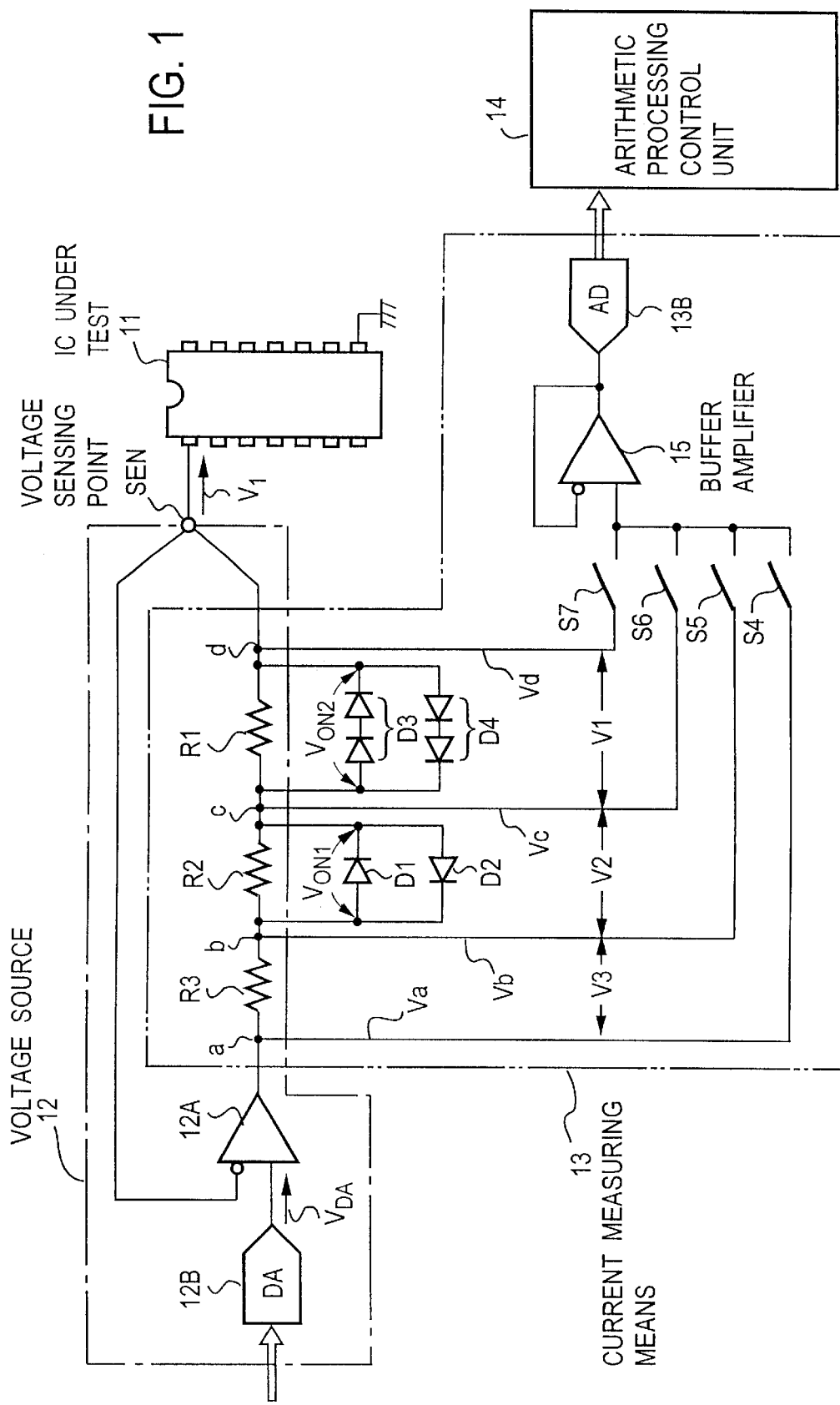
FIG. 1 is a connection diagram depicting, by way of example, the applied-voltage-based current measuring method according to the present invention and the applied-voltage-based current measuring apparatus using the method.
Figure 4:
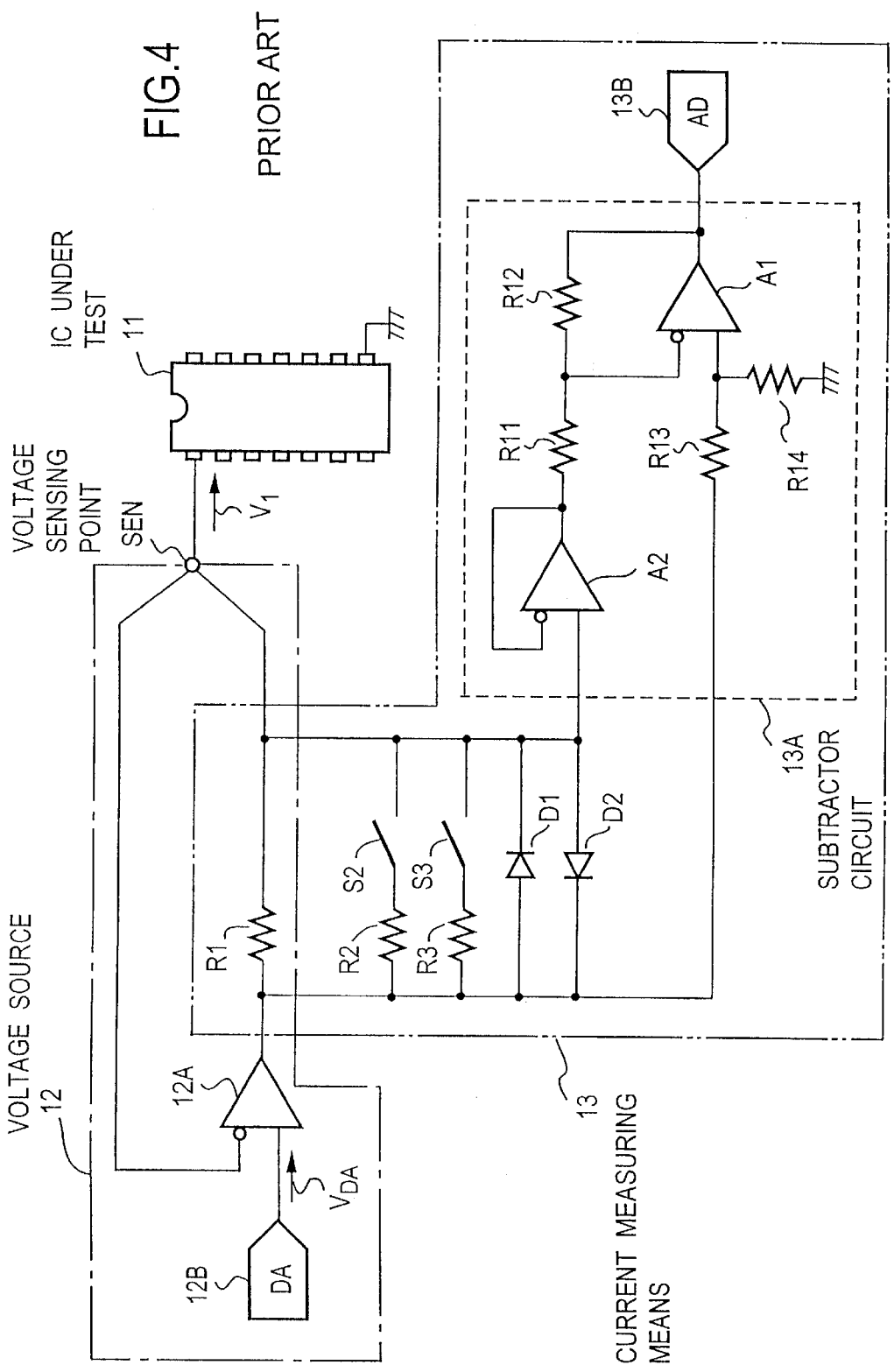
FIG. 4 is a connection diagram for explaining the prior art.
Figure 5:
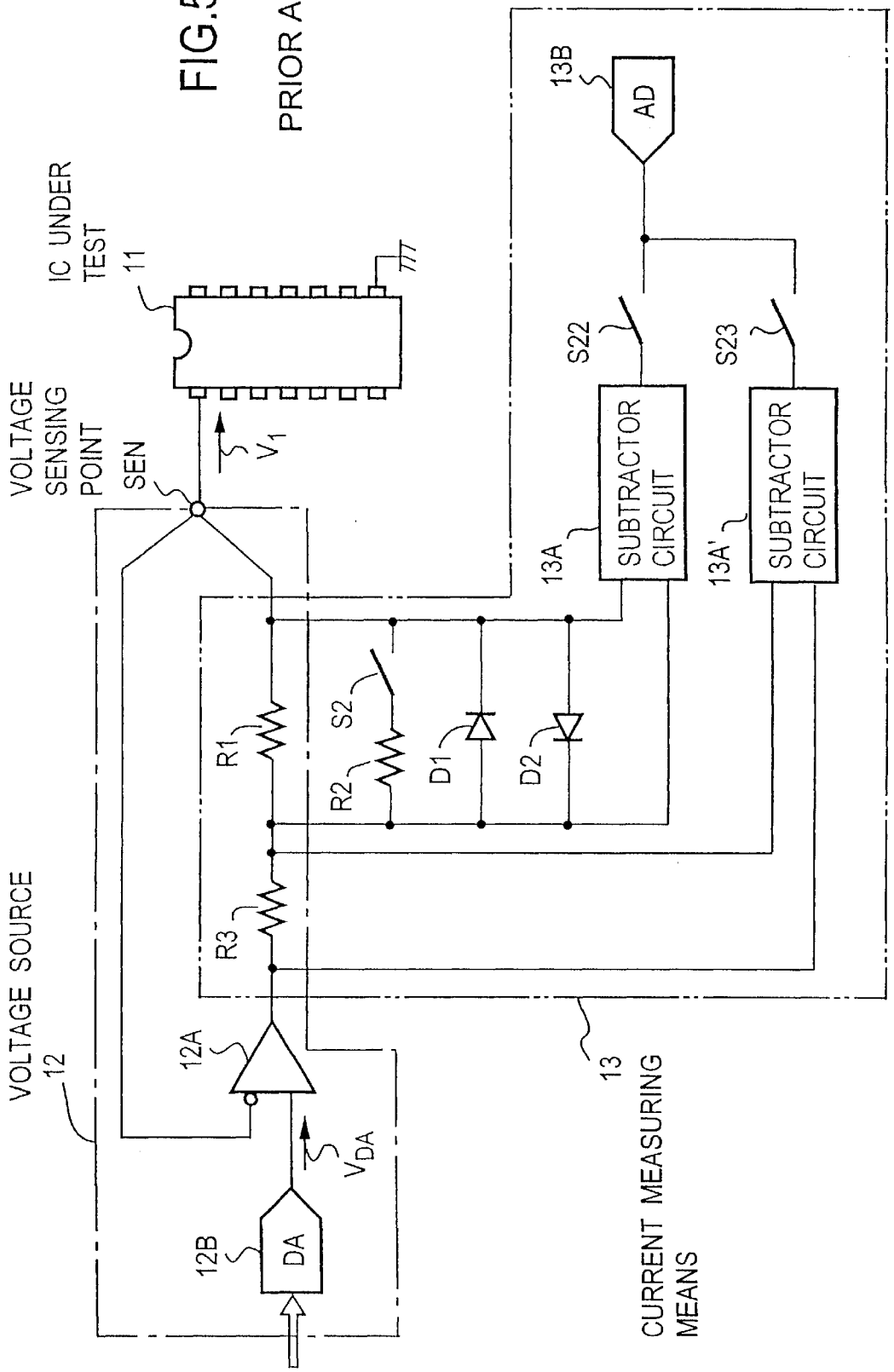
FIG. 5 is a connection diagram showing another prior art example.

In FIG. 1 the parts corresponding to those in FIGS. 4 and 5 are identified by the same reference numerals as those used therein. In the present invention, the current measuring resistors R1, R2 and R3 are all connected in series between the output terminal of the operational amplifier 12 operating as the voltage source 12 and the voltage sensing point SEN, and switching elements D1, D2 and D3, D4 are connected in parallel to the current measuring resistors R2, R1, respectively.

In the example of FIG. 1 the current measuring resistor R3 is a resistor that has a resistance value of 10 ohms or so and is used to measure a large current. Since it is therefore unnecessary (or meaningless) to connect a switching element to this current measuring resistor R3, no switching element is shown. The resistors R2 and R1 are current measuring resistors that measure currents in the range of several microamperes to tens of microamperes. Accordingly, their resistance values are chosen relatively large: for example, 100 kiloohms or so for R1 and 1 kiloohms or so for R2. The switching elements D1, D2 and D3, D4 are connected in parallel to the current measuring resistors R2 and R1 so that the switching elements D1 through D4 serve as bypasses for large currents.

Incidentally, since the resistance value of the current measuring resistor R1 is, in this example, about 100 times larger than the resistance value of the current measuring resistor R2, the voltage that is created across the current measuring resistor R1 takes a large value. On this account, the switching elements are each shown to be formed by a series connection of two diodes and the voltage for their conduction is raised up to approximately 1.2 V.

Moreover, the present invention employs a configuration that: measures voltage values $V_a$, $V_b$, $V_c$ and $V_d$ at respective ends a, b, c and d of the current measuring resistors R1, R2 and R3; inputs the voltage values $V_a$ to $V_d$ into an arithmetic processing control unit 14 formed, for instance, by a microcomputer or the like; computes, by the arithmetic processing control unit 14, voltages that are created across the current measuring resistors R1 to R3; and derives the value of current flowing to a load (the IC under test 11) from the voltage values computed by the arithmetic processing control unit 14.

This embodiment shows the case where: change-over switches S4, S5, S6 and S7 are provided which are connected at one end to the ends a, b, c and d of the current measuring resistors R1, R2 and R3, respectively, and connected together at the other end; the output from a buffer amplifier 15 is applied to the A/D converter 13B; and the voltages at the respective ends a to d are input into the arithmetic processing control unit 14 after A/D conversion by the A/d converter 13B.

The arithmetic processing control unit 14 is provided with: measurement control means which has a microcomputer built-in and effects ON-OFF control of the change-over switches S4 to S7 in a sequential order by the control function of the microcomputer to input the voltages at the respective ends a, b, c and d after the A/D conversion; subtracting means for detecting potential differences V1, V2 and V3 between adjacent ends of the current measuring resistors R1, R2 and R3; decision means for determining if the values of voltages V1, V2 and V3 created across the current measuring resistors R1, R2 and R3, detected by the subtracting means, fall within the current measuring ranges assigned to the current measuring resistors R1, R2 and R3, respectively; and current value calculating means for calculating a current value I1, I2 or I3 from the voltage value decided by the decision means as falling inside the corresponding current measuring range.

Hence, the voltage $V_a$ at the point a, the voltage $V_b$ at the point b, the voltage $V_c$ at the point c, . . . can be measured by putting the change-over switches S4 to S7 by the arithmetic processing control unit 14 in the order S4–S5–S6–S7. By inputting the measured voltages $V_a$, $V_b$, $V_c$ and $V_d$ into the arithmetic processing control unit 14 and by computing therein $V_a-V_b$, it is possible to obtain the voltage V3 developed across the current measuring resistor R3; and by computing $V_b-V_c$, it is possible to detect the voltage V2 that is developed across the current measuring resistor R2. By computing Vc–Vd, it is possible to detect the voltage V1 that is developed across the current measuring resistor R1.

The range of the current value I3 that is measured using the current measuring resistor R3 is preset, for example, above 1 mA. Accordingly, if the voltage V3 has a value larger than 10 Ω×1 mA, the voltage V3 that is created across the current measuring resistor R3 has a correct value, so that the current value I3 to be measured by the current measuring resistor R3 needs only to be calculated from the voltage V3.

When the voltage that is created across the current measuring resistor R3 is below 10 Ω×1 mA, the voltage V2 or V1 that is created across the current measuring resistor R2 or R1 takes a correct value. Hence, the current value I2 or I1 needs only to be calculated from the voltage V2 or V1. In this instance, if the voltage V2 that is created across the current measuring resistor R2 is lower than a conduction voltage 0.6 V of the switching element D1 or D2, then the voltage V1 that is created across the current measuring resistor R1 is compared with a conduction voltage 1.2 V of the switching element D3 or D4; when the voltage V1 is higher than 1.2 V (when the switching element D3 or D4 is conducting), the current value I2 to be measured by the current measuring resistor R2 is calculated from the voltage V2 developed cross the current measuring resistor R2.

In the case where the voltage V2 created across the current measuring resistor R2 is lower than the conduction voltage 0.6 V of the switching element D1 or D2 and the voltage V1 created across the current measuring resistor R1 is lower than the conduction voltage 1.2 V of the switching element D3 or D4, the voltage V1 that is created across the current measuring resistor R1 takes a correct value. Accordingly, the current value I1 to be measured by the current measuring resistor R1 is calculated from the voltage V1.

Figure 2:
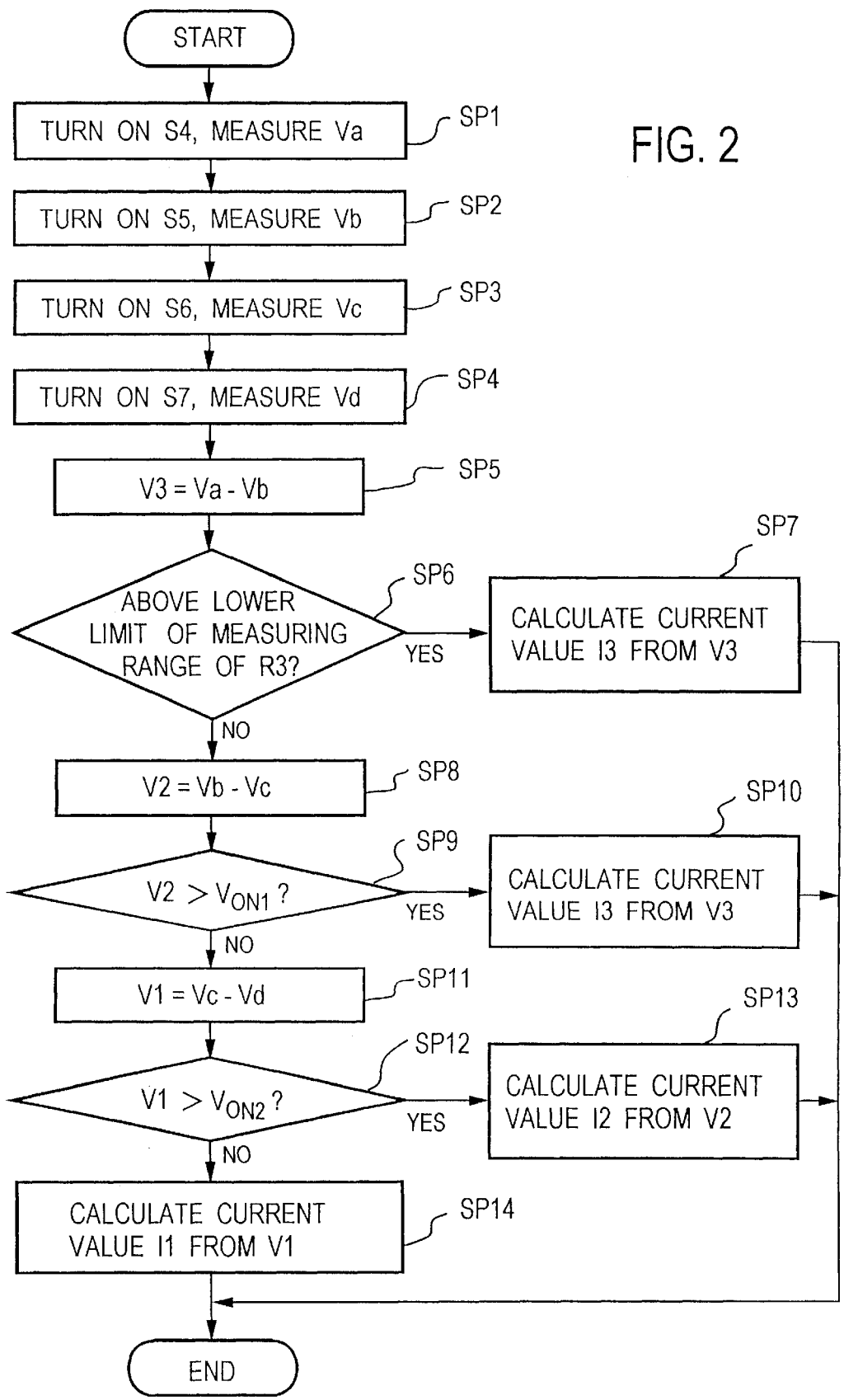
FIG. 2 is a flowchart for explaining the operation of the present invention.

FIG. 2 is a flowchart showing the operations described above. In steps SP1 to SP4 the change-over switches S4 to S7 are sequentially turned ON to input the voltages $V_a$, $V_b$, $V_c$ and $V_d$ into the arithmetic processing control unit 14.

In step SP5 $V3=V_a-V_b$ is calculated. In step SP6 a check is made to determine if the voltage V3 is above the lower limit value (10 Ω×1 mA in the example described above) of the range over which to measure the voltage (current) by the current measuring resistor R3. If the voltage is higher than the lower limit value (YES), then the process branches to step SP7 and terminates with the calculation of the current value I3 from the voltage V3.

If the voltage V3 is lower than the lower limit value (NO), then the process proceeds to step SP8. In step SP8 $V2=V_b-V_c$ is calculated, and the process advances to step SP9. In step SP9 a check is made to determine if the voltage V2 is higher or lower than the conduction voltage $V_{ON1}$ of the switching element D1 or D2. If $V2>V_{ON1}$, the process branches to step SP10; in step SP10 the current value I3 to be measured by the current measuring resistor R3 is calculated from the voltage V3 as in the case of step SP7.

If $V2>V_{ON1}$ is NO in step SP9, then the process advances to step SP11. In step SP11 $V1=V_c-V_d$ is calculated, and the process goes to step SP12. In step SP12 a check is made to determine if the voltage V1 is higher or lower than the conduction voltage $V_{ON2}$ of the switching element D3 or D4. If $V1>V_{ON2}$, the process branches to step SP13; in step SP13 the current value to be measured by the current measuring resistor R2 is calculated from the voltage V2, with which the process ends.

Figure 3:
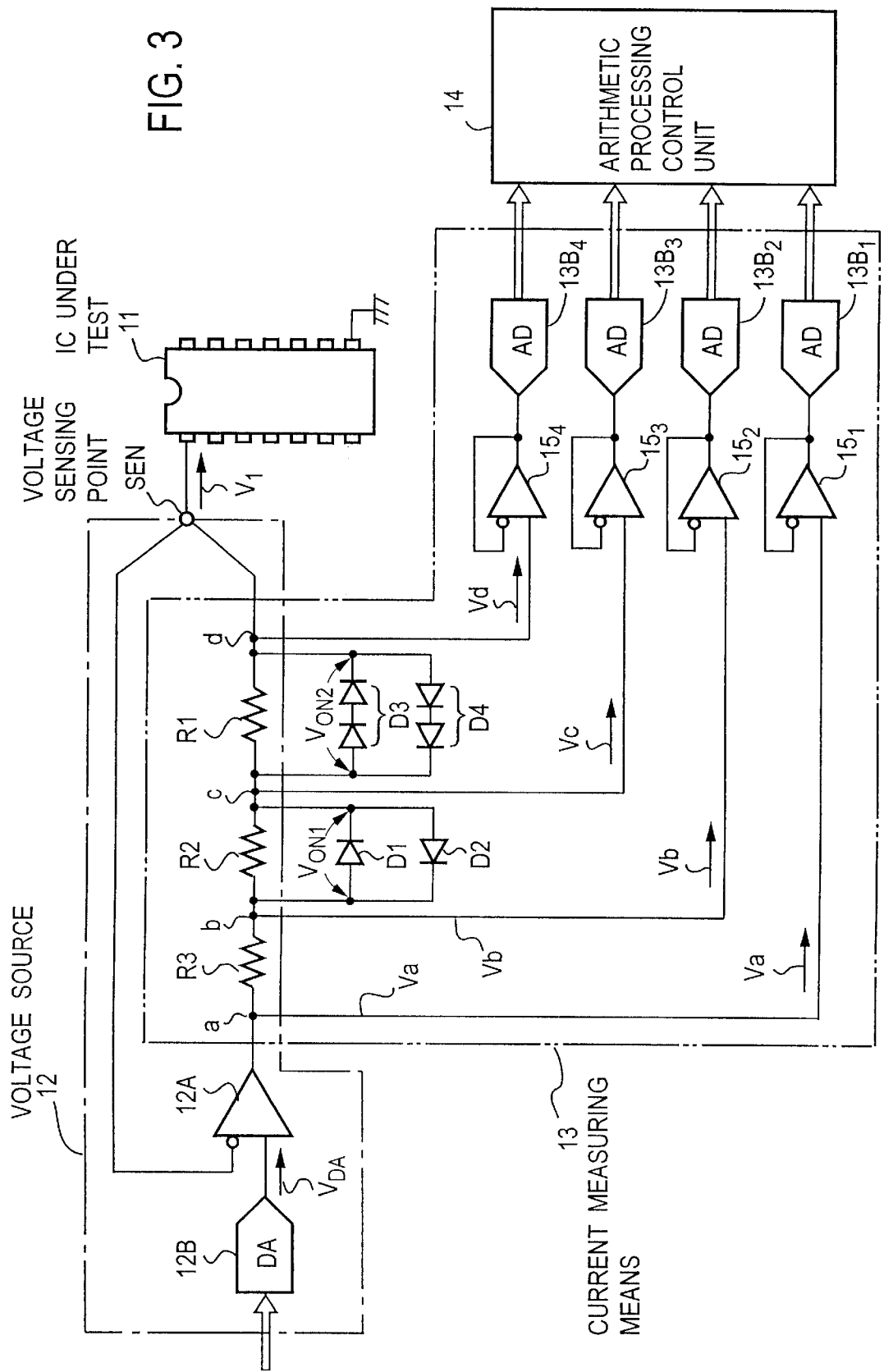
FIG. 3 is a connection diagram for explaining a modified form of the present invention.

FIG. 3 illustrates a modified form of the present invention. This embodiment shows the case of using a configuration in which: the change-over switches S4, S5, S6 and S7 depicted in FIG. 1 are all omitted; the voltages $V_a$, $V_b$, $V_c$ and $V_d$ at all the ends a, b, c and d are detected by buffer amplifiers $15_1$ to $15_4$; the detected voltages $V_a$ to $V_d$ are A/D converted by A/D converters $13B_1$ to $13B_4$; and the A/D-converted voltage values are input into the arithmetic processing control unit 14.

The configuration of this embodiment does not ever involve the change-over operation by the change-over switches S4 to S7 and hence makes it possible to obtain measured results in a very short time. This permits the speeding up of measurements, providing the advantage of further reduction of the time for test.

As described above, according to the present invention, since the change-over switches S4 to S7 for supplying the A/D converter 13B with the voltages $V_a$, $V_b$, $V_c$ and $V_d$ at the respective ends of the current measuring resistors R1 to R3 are not connected to a circuit that turns ON and OFF, and hence they can be formed, for example, by CMOS-structured semiconductor switching elements of large ON-state resistance values. Despite such inexpensive switching elements used, it is possible, therefore, to carry out steps SP1 to SP4 in FIG. 2 at high speed. Furthermore, since no subtractor circuit is used, there is no need of forming highly accurate resistors. Accordingly, the apparatus can be manufactured at low cost as a whole.

In addition, by performing steps SP5 to SP15, it is possible to compute current values of correct measuring ranges and specify the measured values without changing over the measuring range, so that measured results can be obtained in a very short time. Since measurements of a minute and a relatively large current can thus be carried out in a short time, the DC test of the IC under test 11 can be made in short time; the present invention is of great utility when employed by IC manufacturing companies or the like that test ICs in large quantities.

What is claimed is:

1. An applied-voltage-based current measuring method that comprises:

applying the output voltage of an operational amplifier to a voltage sensing point via a current detecting resistor;

supplying a load with the voltage applied to the voltage sensing point;

feeding back the voltage at the voltage sensing point to an inverting input terminal of said operational amplifier;

supplying said load with a voltage identical with that fed to an non-inverting input terminal of said operational amplifier; and measuring current flowing to said load by a voltage which is developed across said current measuring resistor;

wherein:

a plurality of current detecting resistors are prepared in correspondence to current measuring ranges;

the plurality of current measuring resistors are connected in series between an output terminal of said operational amplifier and the voltage sensing point;

voltages which are developed at respective ends of the plurality of current detecting resistors are measured;

the measured voltages are subjected to arithmetic processing to compute voltages which are created across the respective current detecting resistors;

one of the computed voltages is selected according to its value as compared to a threshold value; and the selected voltage is used to calculate the value of current flowing to the load.

2. An applied-voltage-based current measuring apparatus that applies the output voltage of an operational amplifier to a voltage sensing point via a current detecting resistor; supplies a load with the voltage applied to the voltage sensing point; feeds back the voltage at the voltage sensing point to an inverting input terminal of said operational amplifier; supplies said load with a voltage identical with that fed to an non-inverting input terminal of said operational amplifier; and measures current flowing to said load by a voltage which is developed across said current measuring resistor; wherein said apparatus comprises:

a plurality of current measuring resistors which are connected in series between the output terminal of said operational amplifier and said load, and have their resistance values chosen corresponding to current measuring ranges, respectively;

switching elements for current bypass use which are connected in parallel to the plurality of current measuring resistors and turn ON when voltages created across said current measuring resistors reach predetermined values, wherein a respective switching element is connected in parallel to each current measuring resistor; and arithmetic processing control unit which effects control for automatically carrying out measurements of voltages created at respective ends of said current measuring resistors, subjects the measured results to subtraction processing to compute voltages which are developed across the current measuring resistors, and decides and selects that one of the computed results which is contained in any one of the measuring ranges, and calculates the value of current flowing to the load.

3. The applied-voltage-based current measuring apparatus according to claim 2, wherein the voltages developed at the respective ends of said series-connected current measuring resistors are selectively applied via change-over switches to a common buffer amplifier and converted by an A/D converter connected to the output of the buffer amplifier into a digital signal and this digital signal is input into said arithmetic processing control unit for arithmetic processing.

4. The applied-voltage-based current measuring apparatus according to claim 2, wherein the voltages developed at the respective ends of said series-connected current measuring resistors are detected by separately provided buffer amplifiers, respectively, and are each converted by an A/D converter connected to the output side of each buffer amplifier into a digital signal, and this digital signal is input into said arithmetic processing control unit for arithmetic processing.

5. The applied-voltage-based current measuring apparatus according to any one of claims 2 to 4, wherein said arithmetic processing control unit comprises:

subtractor means for obtaining the potential difference between adjacent ends of said series-connected current measuring resistors;

decision means for making a check to determine if the value of voltage created across each current measuring resistor, obtained by the subtractor means, falls inside the current measuring range assigned to said each current measuring resistor; and current value calculating means for calculating the current value from the voltage value decided as falling inside the current measuring range.

6. A method for measuring a current comprising steps that perform the acts of:

measuring a first voltage at one end of a first resistance;

measuring a second voltage at a second end of the first resistance, which is coupled to a first end of a second resistance;

measuring a third voltage at a second end of the second resistance, which is coupled to a first end of a third resistance;

measuring a fourth voltage at a second end of the third resistance;

obtaining a first differential voltage from a difference between the first voltage and the second voltage;

calculating the current from a ratio of the first differential voltage and the first resistance if the first differential voltage is greater than a first threshold value;

obtaining a second differential voltage from a difference between the second voltage and the third voltage;

calculating the current from a ratio of the first differential voltage and the first resistance if the second differential voltage is greater than a second threshold value;

obtaining a third differential voltage from a difference between the third voltage and the fourth voltage;

calculating the current from a ratio of the second differential voltage and the second resistance if the third differential voltage is greater than a third threshold value; and calculating the current from a ratio of the third differential voltage and the third resistance if the third differential voltage is not greater than the third threshold value.

7. A method according to claim 6 wherein:

the first voltage is measured by switchably coupling an analog-to-digital converter to the first end of the first resistance and processing a first output from the analog-to-digital converter;

the second voltage is measured by switchably coupling the analog-to-digital converter to the first end of the second resistance and processing a second output from the analog-to-digital converter;

the third voltage is measured by switchably coupling the analog-to-digital converter to the first end of the third resistance and processing a third output from the analog-to-digital converter; and the fourth voltage is measured by switchably coupling the analog-to-digital converter to the second end of the third resistance and processing a fourth output from the analog-to-digital converter.

8. A method according to claim 6 wherein:

the first voltage is measured by processing a first output from a first analog-to-digital converter coupled to the first end of the first resistance;

the second voltage is measured by processing a second output from a second analog-to-digital converter coupled to the first end of the second resistance;

the third voltage is measured by processing a third output from a third analog-to-digital converter coupled to the first end of the third resistance; and the fourth voltage is measured by processing a fourth output from a fourth analog-to-digital converter coupled to the second end of the third resistance.

9. An applied-voltage-based current measuring apparatus comprising:

an operational amplifier having an input coupled to a voltage source that provides a reference for a voltage to be applied to a load;

a voltage sensing point to which an output voltage derived from an output terminal of the operational amplifier is supplied;

a feed back connection feeding back the voltage at the voltage sensing point to an inverting input terminal of said operational amplifier;

a plurality of current measuring resistors including at least first, second and third resistors connected in series between the output terminal of said operational amplifier and said voltage sensing point, wherein said first resistor has a resistance higher than that of the second and third resistors for measurement of a lowest current range, said third resistor has a resistance lower than that of the first and second resistors for measurement of a highest current range, and said second resistor has a resistance between that of the first and third resistors for measurement of a middle current range;

a first switching element having a low ON resistance value when a first voltage created across the first resistor exceeds a first threshold voltage and connected in parallel to the first current measuring resistor;

a second switching element having a low ON resistance value when a second voltage created across the second resistor exceeds a second threshold voltage lower than said first threshold voltage and connected in parallel to the second current measuring resistor; and an arithmetic processing control unit that calculates the first voltage, the second voltage and a third voltage created across the third resistor, and calculates a value of current flowing to the load under measurement by dividing the third voltage by the resistance value of the third resistor when both the first and second voltages exceed the first and second threshold voltages, respectively, dividing the second voltage by the resistance value of the second resistor when only the first voltage exceeds the first threshold voltage, and dividing the first voltage by the resistance value of the first resistor when none of the first and second voltages exceed the first and second threshold voltages, respectively.

* * * * *